(12) United States Patent
Fuchigami et al.

(10) Patent No.: US 9,358,589 B2
(45) Date of Patent: Jun. 7, 2016

(54) DRY TYPE CLEANING CASE AND DRY TYPE CLEANING DEVICE

(75) Inventors: Akihiro Fuchigami, Kanagawa (JP); Yoichi Okamoto, Kanagawa (JP); Kohji Tsukahara, Kanagawa (JP); Yuusuke Taneda, Kanagawa (JP); Shozo Murata, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 573 days.

(21) Appl. No.: 13/878,461

(22) PCT Filed: Oct. 26, 2011

(86) PCT No.: PCT/JP2011/075235
§ 371 (c)(1),
(2), (4) Date: Apr. 9, 2013

(87) PCT Pub. No.: WO2012/063689
PCT Pub. Date: May 18, 2012

(65) Prior Publication Data
US 2013/0192018 A1    Aug. 1, 2013

(30) Foreign Application Priority Data

Nov. 10, 2010  (JP) .................................. 2010-252120
Jun. 15, 2011  (JP) .................................. 2011-133251

(51) Int. Cl.
*B08B 7/02*         (2006.01)
*B08B 5/04*         (2006.01)
(Continued)

(52) U.S. Cl.
CPC ... *B08B 5/04* (2013.01); *B08B 7/02* (2013.01); *B24C 1/04* (2013.01); *B24C 1/086* (2013.01); *B24C 3/067* (2013.01); *H05K 3/0073* (2013.01); *H05K 3/3489* (2013.01)

(58) Field of Classification Search
CPC .............. B08B 5/04; B08B 7/02; B24C 1/04; B24C 1/086; B24C 3/067
USPC .............................................. 15/320; 134/93
IPC .......................................................... B08B 7/02
See application file for complete search history.

(56) References Cited

U.S. PATENT DOCUMENTS 7,730,896 B2   6/2010   Okamoto et al.
7,743,776 B2   6/2010   Okamoto et al.
(Continued)

FOREIGN PATENT DOCUMENTS

JP    S60-188123    9/1985
JP    H04-083567    3/1992
(Continued)

OTHER PUBLICATIONS

International Search Report Issued on Feb. 7, 2012 in PCT/JP2011/075235 filed on Oct. 26, 2011.

*Primary Examiner* — David Redding
(74) *Attorney, Agent, or Firm* — Cooper & Dunham LLP

(57) ABSTRACT

A dry type cleaning case is for cleaning an object with a medium that flies by a revolving airflow. The dry type cleaning case includes a case unit and a leakage prevention unit. The case unit includes a space in which the medium flies, an opening that contacts the object so that the medium collides with the object, a ventilation path through which air flows into the space from outside, a suction opening that suctions the air that has been guided into the space through the ventilation path, to generate the revolving airflow in the space, and a porous unit through which a substance removed from the object is passed to the suction opening. The leakage prevention unit prevents the medium from leaking outside through the opening from the space, by causing outer air to flow in when the case unit is separated from the object.

12 Claims, 15 Drawing Sheets

(51) Int. Cl.
  *B24C 1/04* (2006.01)
  *B24C 1/08* (2006.01)
  *B24C 3/06* (2006.01)
  *H05K 3/00* (2006.01)
  *H05K 3/34* (2006.01)

(56) References Cited

U.S. PATENT DOCUMENTS

| | | |
|---|---|---|
| 7,758,700 B2 | 7/2010 | Fuchigami et al. |
| 7,854,648 B2 | 12/2010 | Satoh et al. |
| 7,865,997 B2 | 1/2011 | Fuchigami et al. |
| 2007/0283980 A1 | 12/2007 | Okamoto et al. |
| 2009/0314312 A1 | 12/2009 | Fuchigami et al. |
| 2010/0307535 A1 | 12/2010 | Fuchigami et al. |
| 2011/0067731 A1 | 3/2011 | Satoh et al. |

FOREIGN PATENT DOCUMENTS

| | | |
|---|---|---|
| JP | 2007-029945 | 2/2007 |
| JP | 2009-165968 | 7/2009 |
| JP | 2009-226394 | 10/2009 |
| JP | 2010-069368 | 4/2010 |
| JP | 2010-167419 | 8/2010 |

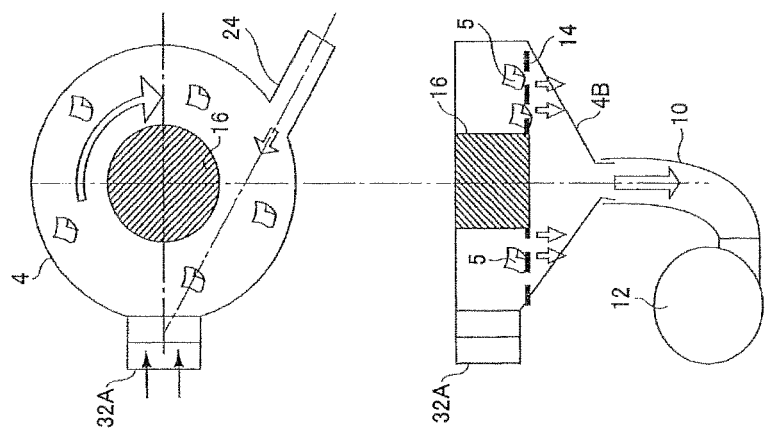
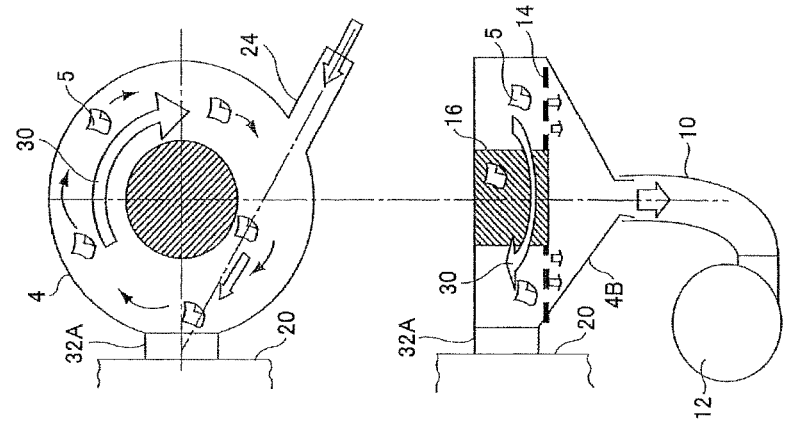

DRY TYPE CLEANING CASE AND DRY TYPE CLEANING DEVICE

TECHNICAL FIELD

The present invention relates to a dry type cleaning device for cleaning a cleaning object by causing a flying cleaning medium to contact (or collide with) the cleaning object. More particularly, the present invention relates to a dry type cleaning device appropriately used as a handy type device that can be applied to a selected part of a cleaning object to clean the selected part, and a dry type cleaning case used in the dry type cleaning device.

For example, the present invention is used for removing flux adhering to a mask jig referred to as a dip pallet or a carrier pallet, which is used in a flow solder bath procedure. More particularly, the present invention is appropriate for removing flux that has adhered to a narrow area such as the side surface or along the periphery of an opening of the cleaning object.

BACKGROUND ART

In recent years, a jig for masking areas other than the area subjected to a soldering process, has been frequently used in a soldering procedure performed with a flow solder bath in print-circuit board manufacturing. When such a mask jig (referred to as dip pallet or carrier pallet) is repeatedly used, flux accumulates and adheres onto the surface of the mask jig, thus deteriorating the performance of the jig. Therefore, it is necessary to periodically clean the mask jig.

Generally, the cleaning process is performed by dipping the cleaning object in a solvent. Therefore, a large amount of solvent is used, which inevitably leads to increased costs. Furthermore, a huge workload is inflicted on the worker.

There is known a method of spraying the solvent onto the cleaning object in a device, instead of dipping the cleaning object in the solvent. However, this method also requires a large amount of solvent.

As a technology for solving the above problems, there is known a dry type cleaning device for cleaning a cleaning object by causing the flying cleaning medium to contact the cleaning object.

Patent documents 1 and 2 disclose a cleaning method of causing a cleaning medium to collide with a cleaning object that is contacting an opening formed in the side surface of a cylindrical container. Specifically, the cleaning medium is caused to fly in the circumferential direction in the container by a revolving airflow of a compressed air current.

However, in this method, because the revolving airflow is formed by the compressed air current, the cleaning medium leaks out of the container when the cleaning object is separated from the opening.

To address this problem, patent document 1 has a net member provided at the opening to prevent the cleaning medium from leaking outside. However, other problems arise by providing the net member, such as a decrease in the energy when the cleaning medium collides with the cleaning object, and a decrease in the cleaning performance as the cleaning medium gets caught in the net member.

In patent document 2, an opening/closing lid for blocking the opening is provided to prevent the cleaning medium from leaking outside. However, when the cleaning object is separated from the opening, the opening/closing lid needs to be quickly moved to block the opening. Thus, excessive attention and workload is required of the worker. Furthermore, the mechanism is complex and hard to operate, and is prone to break down.

In view of the above, the applicant of the present application proposed the following dry type cleaning device (Japanese Patent Application No. 2010-175687). Specifically, a suction unit is connected to a case. While a cleaning object is blocking the opening of the case, a revolving airflow is generated by an air current flowing into the case from outside the case via a ventilation path. Thus, thin flakes of the cleaning medium are caused to fly. Furthermore, a net-type porous member is provided, which allows air and dust to pass into the case but does not allow the cleaning medium to pass outside the case, so that the cleaning medium stays in the area where the revolving airflow is formed. Accordingly, the cleaning medium continues to fly around by the revolving airflow.

According to this dry type cleaning device, even when the cleaning object is separated from the opening, the air pressure in the ventilation path becomes the same as the atmospheric pressure, so that the revolving airflow disappears, and a large amount of the outside air enters the case through the opening by negative pressure caused by suctioning. Accordingly, the cleaning medium in the case is suctioned to the porous member, so that the cleaning medium stays in the case and does not leak outside through the opening.

However, it has been found that in the above-described prior application of the applicant of the present application, when the opening is separated from the cleaning object when the cleaning process has been completed, the cleaning medium sometimes flies outside through the opening, due to an airflow that directly flows into the opening from the air inlet (ventilation path) together with the revolving airflow in the case.

At the very moment when the opening is separated from the cleaning object, it is considered that there are cases where the speed of the airflow flowing into the case through the ventilation path is higher than that of the airflow flowing into the case through the opening. That is to say, there may be a moment where the inertial flow of the cleaning medium flying toward the opening caused by the airflow entering from the ventilation path is faster than the airflow entering the case through the opening, during the time period before the airflow entering the case through the opening reaches a speed that is fast enough to keep the cleaning medium in the case.

It is not preferable for the cleaning medium to fly out from the opening in consideration of pollution and safety of the working environment.

After the cleaning is completed, the cleaning medium does not fly out from the opening if the ventilation path is blocked before separating the opening from the cleaning object. However, if the ventilation path needs to be blocked after the cleaning process, troublesome operations are required of the worker. Besides, if the worker forgets to block the ventilation path, this problem cannot be solved.

Patent Document 1: Japanese Laid-Open Patent Application No. H4-83567

Patent Document 2: Japanese Laid-Open Patent Application No. S60-188123

Patent Document 3: Japanese Laid-Open Patent Application No. 2009-226394

DISCLOSURE OF INVENTION

The present invention has been made in view of the above-described problems, and it is an object of at least one embodiment of the present invention to provide a dry type cleaning case capable of preventing a cleaning medium from flying out of the opening without requiring a special operation when the opening is separated from the cleaning object after the cleaning process is completed, and a dry type cleaning device including the dry type cleaning case.

An aspect of the present invention provides a dry type cleaning case for cleaning a cleaning object by causing a cleaning medium to fly by a revolving airflow and applying the cleaning medium to the cleaning object, the dry type cleaning case including a case unit; and a cleaning medium leakage prevention unit, wherein the case unit includes an inner space in which the cleaning medium flies, an opening that contacts the cleaning object so that the cleaning medium collides with the cleaning object, a ventilation path through which air flows into the inner space from outside, a suction opening that suctions the air that has been guided into the inner space through the ventilation path, to generate the revolving airflow in the inner space, and a porous unit through which a substance removed from the cleaning object is passed to the suction opening, wherein the cleaning medium leakage prevention unit prevents the cleaning medium from leaking outside through the opening from the inner space, by causing outer air to flow in when the case unit is separated from the cleaning object.

BRIEF DESCRIPTION OF DRAWINGS

FIGS. 2A and 2B are for describing a cleaning process;

FIG. 13A illustrates a state where the case is separated from the cleaning object, and FIG. 13B illustrates a state during cleaning;

BEST MODE FOR CARRYING OUT THE INVENTION

Embodiments of the present invention are described below with reference to the accompanying drawings.

Definitions of the terms used in the present specification are described as follows.

A case according to an embodiment of the present invention is a container with an inner space that is shaped such that a revolving airflow can be easily generated. A shape in which a revolving airflow can be easily generated has continuous inner walls along which the airflow flows and circulates. Preferably, the inner walls or the inner space is shaped as a rotating body.

A ventilation path is for facilitating the airflow to flow in a fixed direction, and is generally a pipe having a smooth inner surface. However, a plate-shaped flow path control plate having a smooth surface may also be used as a ventilation path, because a rectifying effect of facilitating the air to flow in a direction along a surface can be achieved.

Furthermore, the case is generally shaped such that the air flows linearly. However, a rectifying effect can be achieved even if the shape has a moderate curve that does not generate much of a flow path resistance. However, unless described otherwise, the direction of the ventilation path corresponds to the direction of the airflow that blows in from the airflow entrance.

In an embodiment of the present invention, a ventilation path having one end connected to the airflow entrance at the inner wall of the case, and the other end opened to the atmosphere outside the case, is referred to as an inlet. The inlet generally has low fluid resistance and a smooth inner surface. The cross-sectional shape of the tube may be a circle, a rectangle, a slit, etc.

In an embodiment of the present invention, a revolving airflow is formed as follows. An airflow is accelerated by an airflow flowing in from the airflow entrance, the accelerated airflow flows along the inner wall of the case while changing its direction, circulates back to the position of the airflow entrance, and merges with an airflow flowing in from the airflow entrance. Generally, the revolving airflow is generated by blowing an airflow in a direction of the tangent line of inner walls of the closed space surrounded by the continuous inner walls. The airflow may consist only of air.

In an embodiment of the present invention, unless described otherwise, an opening corresponds to a three dimensional space shaped as a path, which is formed of a case opening on the side surface of the cleaning case, a cleaning medium leakage prevention unit provided on the case opening, and a contact opening of the cleaning medium leakage prevention unit that directly contacts the cleaning object.

Figure 1:
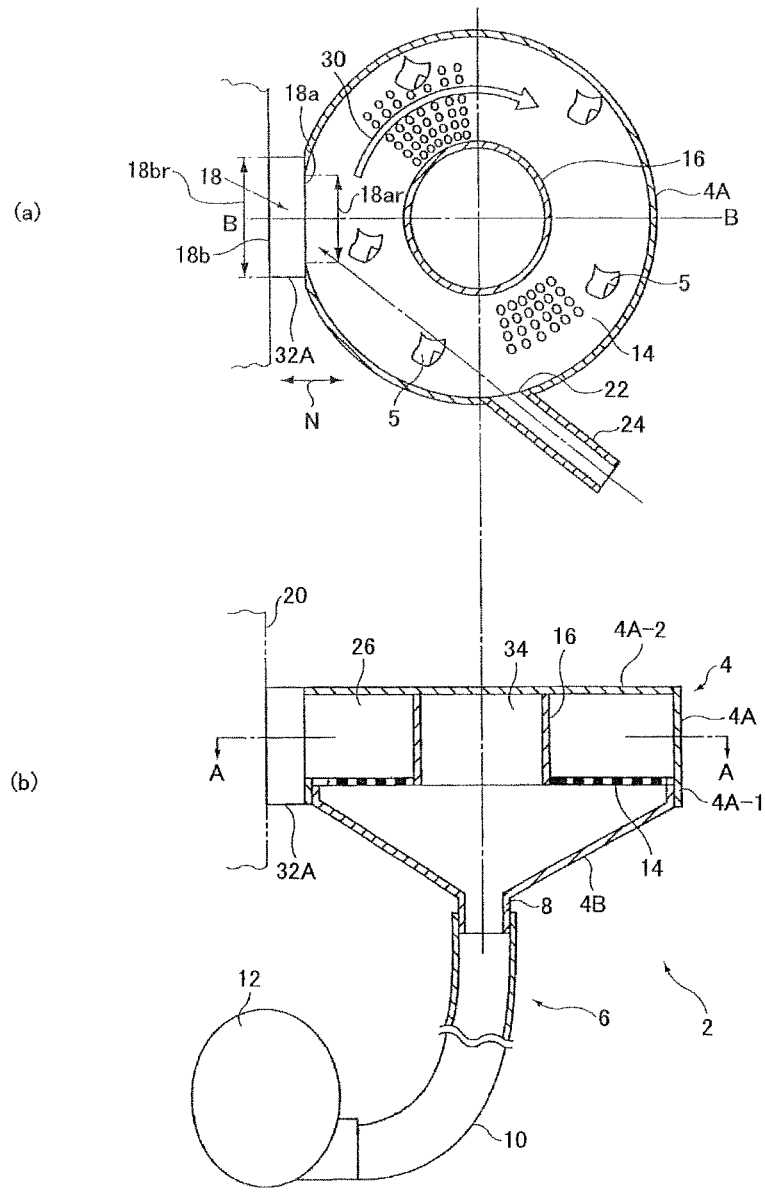
FIG. 1 illustrates schematic cross-sectional views of a dry type cleaning device according to a first embodiment of the present invention.

A first embodiment is described with reference to FIGS. 1 through 9. First, a description is given of an overview of a handy type, dry type cleaning device 2 according to the present embodiment based on FIG. 1. FIG. 1 (a) is a cross sectional view cut along a line A-A in FIG. 1 (b), and FIG. 1 (b) is a cross sectional view cut along a line B-B in FIG. 1 (a).

The dry type cleaning device 2 includes a dry type cleaning case (hereinafter, simply referred to as a "case" or a "case unit") 4 including a space where a cleaning medium 5 flies, and a suction unit 6 that turns the pressure inside of the case 4 into negative pressure.

The case 4 includes a cylindrical top case GA as the main unit, and an inverted cone-shaped bottom case 4B, forming a single unit. The words "top" and "bottom" included in the names of the elements are merely used as a matter of convenience in FIG. 1; these words do not necessarily indicate the actual locations in the device.

The bottom case 4B functions as a suction duct, and has a suction opening 8 provided integrally at the apex of the cone shape of the bottom case 4B.

The suction unit 6 includes a flexible suction hose 10 having one end connected to the suction opening 8, and a suction device 12 connected to the other end of the suction hose 10. As the suction device 12, a domestic cleaner, a vacuum motor, a vacuum pump, or a device that indirectly generates low pressure or negative pressure by directing pressure of a fluid may be appropriately used. The positional relationships such as the horizontal orientation of the members are merely standards used for illustration in FIG. 1.

The bottom surface of the top case 4A corresponds to a fitting recession part 4A-1 that joins with the top end of the bottom case 4B. The top case 4A and the bottom case 4B can be separated. The top case 4A is sealed by a top surface 4A-2.

At the boundary between the top case 4A and the bottom case 4B at the bottom surface of the top case 4A, a porous separating plate 14 is provided as a porous unit. The separating plate 14 is a plate member having holes like a punching metal. The separating plate 14 is for preventing the cleaning medium 5 from moving to the bottom case 4B when suctioned. In FIG. 1 (a), the separating plate 14 is partially not shown. Furthermore, the sizes of the flakes of the cleaning medium 5 are exaggerated so that they are noticeable in the figures.

The porous unit may be in any form such as a slit plate and a net, as long as there are many small holes through which the cleaning medium 5 cannot pass but air and dust (the substance that is removed from the cleaning object) can pass. Furthermore, the porous unit may be made of any material such as resin or metal, as long as the material has a smooth surface.

The porous unit is located on a plane orthogonal to the center axis of the revolving airflow. By locating the porous unit orthogonal to the center axis of the revolving airflow, the airflow flows in a direction along the porous unit and prevents the cleaning medium 5 from accumulating.

To prevent the revolving airflow from attenuating, the inside of the case 4 is preferably smooth and free of any unevenness or irregularities.

The porous unit is located on a plane extending along the revolving airflow, so that the cleaning medium adhering to the porous unit can be caused to fly once again.

The material of the case 4 is not particularly limited. For example, the case 4 is preferably made of metal such as aluminum and stainless steel, in consideration of preventing attrition due to foreign matter adhering to the case 4 and friction between the case 4 and the cleaning medium 5. However, the case 4 may be made of resin.

At the center of the inside of the top case 4A, a cylindrical flow path limiting member 16 is provided as part of the case 4, so as to have an axis common to the cylinder axis of the top case 4A. The lower end of the flow path limiting member 16 is fixed to the separating plate 14.

The flow path limiting member 16 is provided for the purpose of reducing the sectional area of the revolving airflow to increase the speed of the revolving airflow. According to the flow path limiting member 16, a ring-shaped space having smooth walls in which the revolving airflow moves (space where the cleaning medium 5 flies) is formed inside the top case 4A.

Depending on the shape of the top case 4A, the flow path limiting member 16 may not have a central axis common to that of the top case 4A; the central axis of the flow path limiting member 16 may be eccentric with respect to that of the top case 4A.

In a part of the side surface of the top case 4A, a case opening 18a is formed to cause the cleaning medium 5 flying by the revolving airflow to contact or collide with the cleaning object. The case opening 18a is part of an opening 18 described below.

The top case 4A is a cylinder whose height is shorter than its diameter. The case opening 18a is provided on a part of the side surface corresponding to the height of the top case 4A. Accordingly, as shown in FIG. 1 (b), the case 4 is laid out such that the outer peripheral parts of the case 4 other than the case opening 18a are positioned away from a cleaning object 20. Thus, the freedom of locally contacting the cleaning object 20, i.e., the freedom in pin-point cleaning is enhanced.

The case opening 18a is formed by cutting the side surface of the top case 4A along a plane parallel to the cylinder axis, and has a rectangular shape as viewed from the direction orthogonal to the cylinder axis.

A cleaning medium leakage prevention unit 32A is attached to the opening 18. The cleaning medium leakage prevention unit 32A is for preventing the cleaning medium 5 from leaking outside the case 4 through the case opening 18a, when the case 4 is separated from the cleaning object 20 after the cleaning process has been completed.

The cleaning medium leakage prevention unit 32A can expand and contract in the direction in which the case 4 contacts and separates from the cleaning object 20 (direction indicated by an arrow N). Details of the cleaning medium leakage prevention unit 32A are given below.

On the side surface of the top case 4A, an airflow entrance 22 is formed. At the airflow entrance 22, an inlet 24 serving as an revolving airflow generating unit and a ventilation path is connected from the outside of the top case 4A, and is integrally fixed to the top case 4A.

The inlet 24 is set to be substantially parallel to the separating plate 14, and the ventilation direction in the inlet 24 is tilted with respect to the direction of the radius of the top case 4A. A line extending from the center of the inlet 24 reaches the cleaning object 20 via the opening 18.

Figure 5:
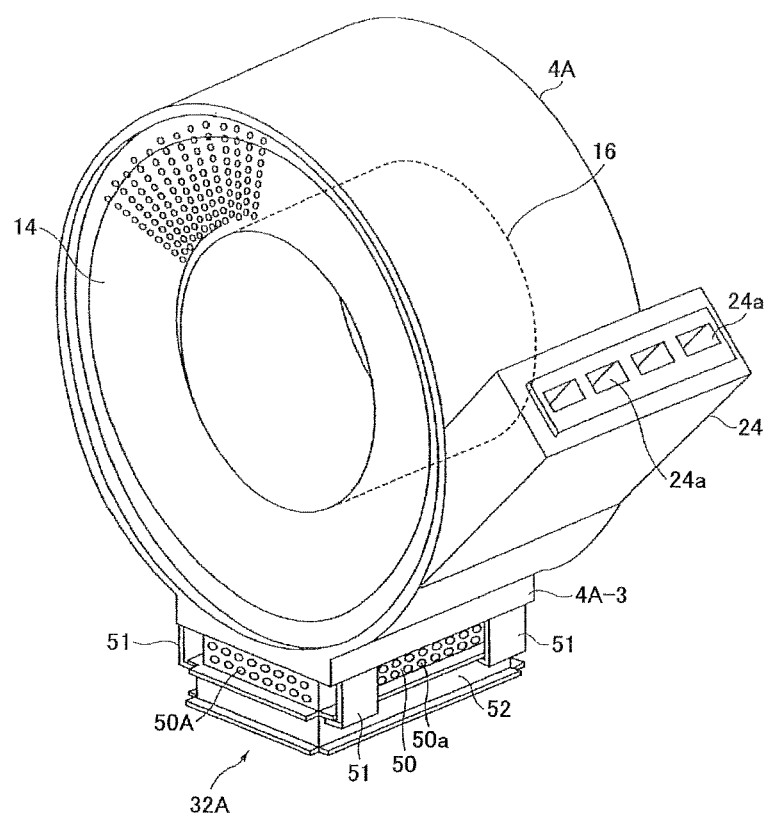
FIG. 5 is a perspective view of the top case including the cleaning medium leakage prevention unit.

As shown in FIG. 5, the inlet 24 has a width extending in the height direction of the top case 4A, and the inside of the inlet 24 is partitioned into four ventilation paths 24a. There may be a single inlet having a diameter or width that is narrower than the height of the top case 4A, or plural inlets may be arranged in the height direction of the top case 4A.

As shown in FIG. 1, a contact opening 18b is positioned at the front end of the of the cleaning medium leakage prevention unit 32A facing the cleaning object 20. When the contact opening 18b contacts the cleaning object 20 and the opening 18 is blocked, the case 4 becomes a closed space, and the outside air flows in through the inlet 24 at high speed. This high-speed airflow further accelerates the cleaning medium 5 toward the cleaning object 20 via the opening 18, and generates a revolving airflow 30.

The revolving airflow 30, which is generated when the closed space is formed, blows off the cleaning medium 5 that has been suctioned onto the separating plate 14 and causes the cleaning medium 5 to fly once again.

The opening 18 is a three-dimensional space shaped as a path. The opening 18 includes the case opening 18a, the internal space in the cleaning medium leakage prevention unit 32A, and the contact opening 18b. In FIG. 1 (a), 18ar denotes the width of the case opening 18a, and 18br denotes the width of the contact opening 18b.

The case opening 18a and the contact opening 18b are large enough such that when the case opening 18a and the contact opening 18b are opened, the inner pressure in the airflow entrance 22 becomes the same as or in the vicinity of the atmospheric pressure. Furthermore, the airflow entrance 22 is located at a position such that when the opening 18 is opened, the inner pressure in the airflow entrance 22 becomes the same as or in the vicinity of the atmospheric pressure.

By the above-described configuration, when the dry type cleaning device 2 is not applied to the cleaning object 20, the inner pressure at the airflow entrance 22 approaches the atmospheric pressure. Therefore, the difference between the inner pressure at the airflow entrance 22 and the outside pressure is reduced. Consequently, the amount of airflow flowing into the dry type cleaning device 2 is decreased significantly. Meanwhile, the airflow that flows in through the opening 18 is increased. Accordingly, the cleaning medium 5 is prevented from leaking outside from the case 4.

However, as described above, there are cases where the cleaning medium 5 flies out from the opening 18 at the moment when the opening 18 is opened.

Furthermore, when the opening 18 is opened, the total amount of airflow flowing in is two to three times that when the opening 18 is closed. Therefore, the flake-type cleaning medium 5 is suctioned onto the porous member (separating plate 14), so that the cleaning medium 5 does not fly once again and does not leak outside of the case 4.

The cleaning medium 5 is an assembly of thin cleaning flakes. However, in the present specification, the cleaning medium 5 may also mean a single thin cleaning flake.

A flake-type cleaning medium 5 has an area of less than or equal to 100 mm$^2$. Furthermore, the cleaning medium 5 is a film made of a material with durability, such as polycarbonate, polyethylene terephthalate, acryl, and cellulose resin. The cleaning medium 5 has a thickness of greater than or equal to 0.02 mm and less than or equal to 0.2 mm.

However, depending on the cleaning object, it may be effective to vary the thickness, size, and material of the cleaning medium. Embodiments of the present invention may include such cleaning media of various sizes and materials, and therefore the cleaning medium is not limited to the aforementioned conditions.

The cleaning medium may be made of materials other than resin, such as paper, cloth, a mineral such as mica, ceramics, glass, and metallic foil, as long as they are thin, light flakes that can easily fly.

A ring-type internal space 26 in the top case 4A has a function of causing the cleaning medium 5 to fly by the revolving airflow and contact the cleaning object 20 facing the opening 18.

An internal space 34 in the flow path limiting member 16 is a static space that is unaffected by suction air.

With reference to FIGS. 2A and 2B, a description is given of a cleaning process performed by the dry type cleaning device 2 having the above-described configuration. In FIGS. 2A and 2B, the thicknesses of the members are not expressed, and the internal space 34 that is the static space is illustrated by hatching.

FIG. 2B illustrates a state where the cleaning medium leakage prevention unit 32A is separated from the cleaning object 20 and the opening 18 is opened to suction air. FIG. 2A illustrates a sate where the cleaning medium leakage prevention unit 32A is pressed against the cleaning object 20 so as to be contracted, and the opening 18 is completely closed.

When the cleaning medium 5 is not retained in the case 4, the cleaning medium 5 is suctioned into the case 4 through the opening 18 while suctioning the inside of the case 4, before performing the cleaning process. The cleaning medium 5 that is supplied into the case 4 is suctioned to the separating plate 14 and retained in the case 4, as shown in the lower diagram of FIG. 2 (b).

The pressure inside of the case 4 becomes negative pressure due to the air suctioning, and therefore the air outside the case 4 flows into the case 4 through the inlet 24. At this time, the speed and flow rate of the airflow inside the inlet 24 are low. Therefore, the revolving airflow 30 is not as powerful to cause the cleaning medium 5 to fly.

When the cleaning medium 5 is supplied/retained in the case 4, as shown in FIG. 2 (a), the cleaning medium leakage prevention unit 32A is applied in close contact to the part to be cleaned on the surface of the cleaning object 20 so as to be contracted, and the opening 18 is closed.

When the opening 18 is closed, the suction air from the opening 18 is stopped. Therefore, the negative pressure in the case 4 increases at once, the air suctioned through the inlet 24 increases both in terms of amount and speed, and the air suctioned through the inlet 24 is rectified, so that a high-speed airflow blows into the case 4 from the outlet (the airflow entrance 22) of the inlet 24.

The airflow blown into the case 4 causes the cleaning medium 5 retained on the separating plate 14 to fly toward the surface of the cleaning object 20 facing the opening 18.

The above-described airflow turns into the revolving airflow 30, and flows in a circular ring along the inner wall of the case 4. Part of the revolving airflow 30 flows through the holes of the separating plate 14 and is suctioned by the suction unit 6.

As described above, when the revolving airflow 30 flowing in a circular ring in the case 4 returns to the outlet of the inlet 24, the airflow entering from the inlet 24 merges with the revolving airflow 30, so that the revolving airflow 30 is accelerated. In this manner, the revolving airflow 30 is stably formed in the case 4.

The cleaning medium 5 is revolved in the case 4 by the revolving airflow 30, and is caused to repeatedly collide with the surface of the cleaning object 20. Due to the impact caused by this collision, the dirt separates from the surface of the cleaning object 20 as particles or powder.

The separated dirt is discharged outside the case 4 by the suction unit 6 through the holes of the separating plate 14.

The revolving airflow 30 formed in the case 4 has a revolution axis that is orthogonal to the surface of the separating plate 14, and the revolving airflow 30 becomes parallel to the surface of the separating plate 14.

Thus, the revolving airflow 30 blows in a horizontal direction onto the cleaning medium 5 that is suctioned onto the surface of the separating plate 14, and enters in between the cleaning medium 5 and the separating plate 14. Accordingly, the cleaning medium 5 suctioned to the separating plate 14 is peeled off from the separating plate 14, and is caused to fly once again.

Furthermore, as the opening 18 is closed, the negative pressure in the top case 4A increases and the pressure inside the bottom case 4B approaches negative pressure. Therefore, the force that suctions the cleaning medium 5 onto the surface of the separating plate 14 decreases. Accordingly, the cleaning medium 5 can fly easily.

The revolving airflow 30 is accelerated in a fixed direction, and therefore the speed of the revolving airflow 30 is easily increased, and the cleaning medium 5 easily flies at high speed. When the cleaning medium 5 is flying around at high speed, the cleaning medium 5 is unlikely to be suctioned to the separating plate 14. Furthermore, the dirt adhering to the cleaning medium 5 is easily separated from the cleaning medium 5 due to a centrifugal force.

Figure 3:
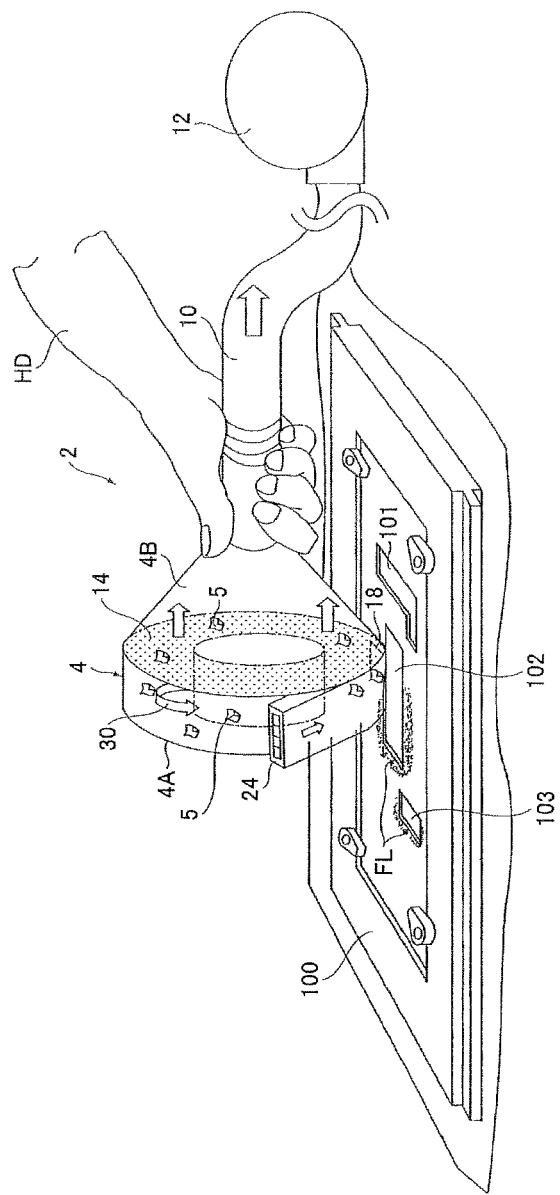
FIG. 3 is a perspective view of the dry type cleaning device being used.

FIG. 3 illustrates an actual example of a cleaning process performed by using the dry type cleaning device 2. In FIG. 3, the cleaning medium leakage prevention unit 32A is not shown.

The cleaning object is a dip pallet used in a flow solder bath procedure, and is denoted by a reference numeral 100.

The dip pallet 100 has mask openings 101, 102, and 103. Around each of these mask openings 101, 102, and 103, flux FL is accumulated/fixed. This accumulated/fixed flux FL is the dirt to be removed.

As shown in FIG. 3, the user grabs the bottom part (the suction opening 8) of the bottom case 4B with his hand HD. While the dry type cleaning device 2 is in a suction state, the user presses the cleaning medium leakage prevention unit 32A against the part to be cleaned.

Before the cleaning medium leakage prevention unit 32A is pressed against the part to be cleaned, the air inside the case 4 is suctioned, and the cleaning medium 5 is suctioned to the separating plate 14. Therefore, even if the opening 18 is directed downward, the cleaning medium 5 does not leak outside from the case 4.

As a matter of course, after the cleaning medium leakage prevention unit 32A is pressed against the part to be cleaned, the inside of the case 4 becomes airtight, and therefore the cleaning medium 5 does not leak outside.

When the cleaning medium leakage prevention unit 32A is pressed against the part to be cleaned, the airflow from the inlet 24 is rapidly increased, a strong revolving airflow 30 is generated inside the case 4, and the cleaning medium 5 suctioned to the separating plate 14 is caused to fly. Accordingly, the cleaning medium 5 collides with the flux FL that has adhered to the part to be cleaned on the dip pallet 100, so that the flux FL is removed.

The worker performing the cleaning holds the bottom part of the bottom case 4B with his hand HD, and moves the dry type cleaning device 2 along the dip pallet 100 to the respective parts to be cleaned, so that all of the adhered flux FL can be removed.

FIG. 3 illustrates a state where the parts surrounding the mask opening 101 of the dip pallet 100 have been cleaned, while the parts surrounding the mask openings 102 and 103 are yet to be cleaned.

Even if the opening 18 is separated from a part to be cleaned to move the opening 18 to another part to be cleaned, due to a fly prevention effect achieved with the cleaning medium leakage prevention unit 32A as described below and the above-described cleaning medium suction effect, the cleaning medium 5 is prevented from leaking out of the case 5. Therefore, the number of flakes of the cleaning medium 5 can be maintained, so that the cleaning performance is not deteriorated due to a decrease in the amount of the cleaning medium 5.

The cleaning medium 5 eventually breaks by being repeatedly used, due to the impact when the cleaning medium 5 collides with the cleaning object. Accordingly, the broken cleaning medium 5 is suctioned/collected by the suction device 12 together with the flux (dirt) that has been removed from the parts to be cleaned on the dip pallet 100. Thus, after using the dry type cleaning device 2 for a long period of time, the amount of the cleaning medium 5 held in the case 4 decreases.

In this case, new cleaning medium 5 flakes are supplied in the case 4.

Next, a detailed description is given of the configuration and functions of the cleaning medium leakage prevention unit 32A.

Figure 4:
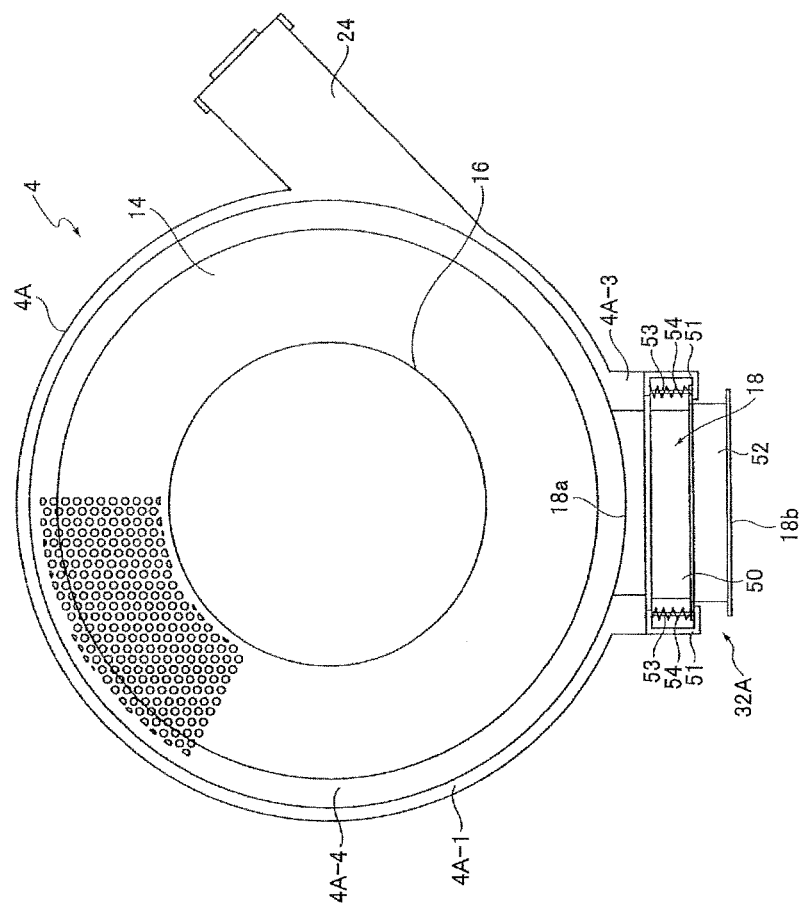
FIG. 4 is a side view of a top case including a cleaning medium leakage prevention unit.

FIG. 4 illustrates the case 4 without the bottom case 4B. On the outer peripheral surface of the top case 4A, a rectangular thick portion 4A-3 is formed around the case opening 18a. The cleaning medium leakage prevention unit 32A is fixed to the thick portion 4A-3.

The cleaning medium leakage prevention unit 32A includes a fixed tube 50 that is fixed to the thick portion 4A-3, a movable tube 52 that is slidably fit to the outer surface of the fixed tube 50, and coil springs 54 acting as biasing means for causing the movable tube 52 to protrude toward the outside of the case 4 (the direction toward the cleaning object 20 along a contact/separation direction N indicated in FIG. 1 ($a$)) when an external force is not applied.

The fixed tube 50 includes brackets 51 having a U shape, and shafts 53 are fixed to the brackets 51 in a vertical direction. The shafts 53 pierce through latch parts 52$a$ (see FIG. 7) that extend substantially horizontally from the top side of the movable tube 52. The movable tube 52 is guided to slide in the vertical direction by the outer wall of the fixed tube 50. In order to prevent the positions of the coil springs 54 from shifting, the coil springs 54 are fitted to the shafts 53, in between the upper edges of the brackets 51 and the latch parts 52$a$ (see FIG. 7). In the present embodiment, coil springs are used, but the same effects can be used by using elastic foam instead of coil springs.

In FIG. 4, 4A-4 denotes an element functioning as a stopper rim used for fitting the bottom case 4B into the top case 4A (the stopper rim 4A-4 is not shown in FIG. 1). The separating plate 14 is placed on the top side of the stopper rim 4A-4 (back side in the fitting in direction). Only some of the pores of the separating plate 19 are shown in FIG. 4 (and in the other figures).

Figure 6:
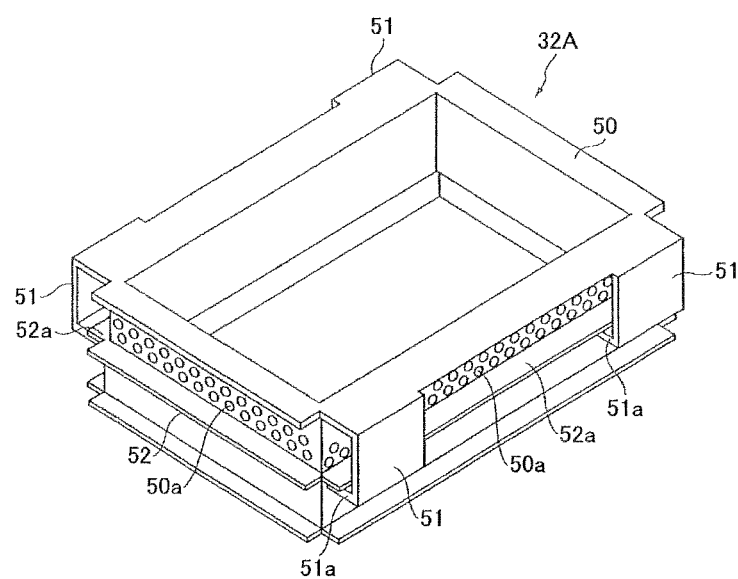
FIG. 6 is a partial perspective view of the cleaning medium leakage prevention unit.

As shown in FIGS. 5 and 6, the brackets 51 are formed in the four corners of the fixed tube 50. On the top side of the movable tube 52, the latch parts 52$a$ are formed on both sides so as to correspond to the brackets 51. There is a hole (not shown) formed in each latch part 52$a$, which is large enough to allow the shaft 53 to pass through with plenty of space.

Bottom rims 51$a$ of the brackets 51 function as stoppers for regulating the bottom limit of the latch parts 52$a$ and for limiting the movable tube 52 to slide in the fixed tube 50 for more than a predetermined extent.

On the four side surfaces of the fixed tube 50, plural outer air inflow holes 50$a$ are formed, which constitute a ventilation unit. The outer air inflow holes 50$a$ have sizes that do not allow the cleaning medium 5 to pass through.

Figure 7:
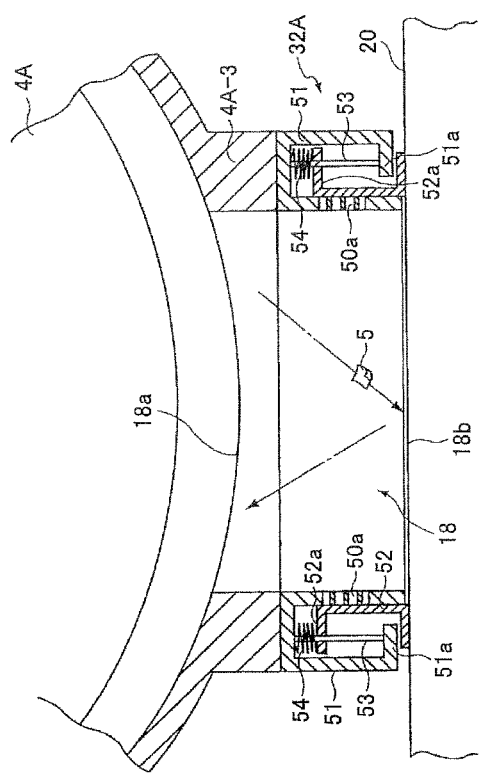
FIG. 7 is a cross-sectional view of the cleaning medium leakage prevention unit during the cleaning process.
Figure 8:
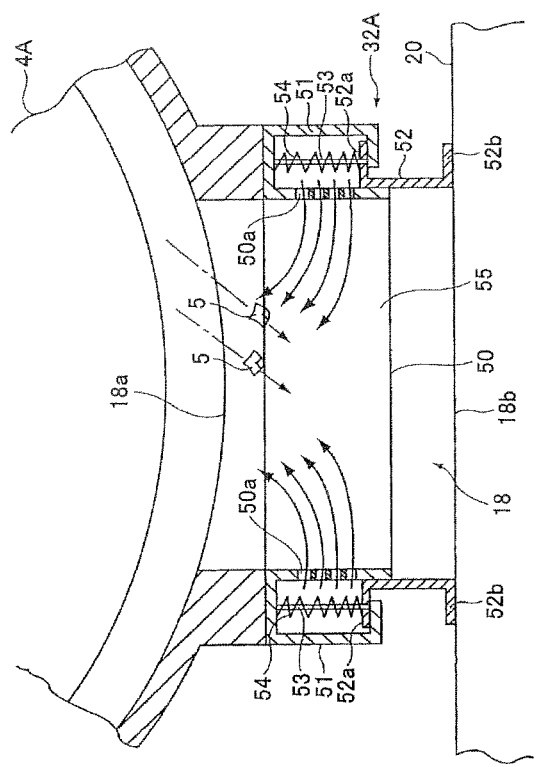
FIG. 8 is a cross-sectional view of the cleaning medium leakage prevention unit when a case is moved to open an opening after the cleaning process.
Figure 9:
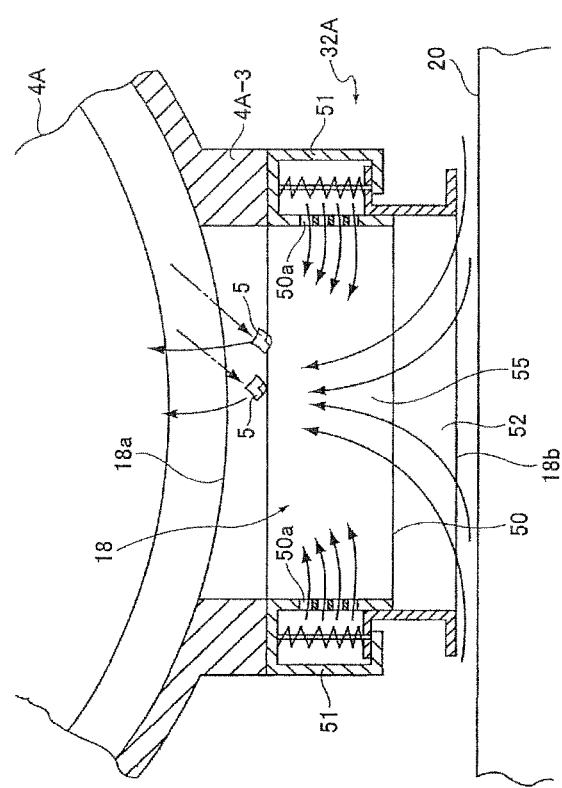
FIG. 9 is a cross-sectional view of the cleaning medium leakage prevention unit being completely separated from the cleaning object.

With reference to FIGS. 7 through 9, a description is given of a cleaning medium leakage prevention function of the cleaning medium leakage prevention unit 32A.

FIG. 7 illustrates a state where cleaning is performed. In this state, the movable tube 52 is compressed toward the case 4, so that the whole cleaning medium leakage prevention unit 32A is contracted. The outer air inflow holes 50$a$ in the fixed tube 50 are blocked on the side surfaces of the movable tube 52, and therefore the opening 18 is closed so that air does not flow in from outside.

In a closed space 55 (see FIG. 8) partitioned by the cleaning medium leakage prevention unit 32A and located between the opening 18 and the cleaning object 20, the cleaning medium 5 flies at high speed and collides with the surface of the cleaning object 20 to remove the dirt, and then converges with the revolving airflow by the negative pressure of the revolving airflow. This operation is repeatedly performed.

After the cleaning is completed, and the worker moves the case 4 away from the cleaning object 20, as shown in FIG. 8, the movable tube 52 slides with respect to the fixed tube 50 while a contact opening part 18b, which is the front end of the movable tube 52, is contacting the cleaning object 20. As the movable tube 52 slides, the outer air inflow holes 50a of the fixed tube 50 gradually open, so that the outer air flows in at high speed through the outer air inflow holes 50a.

As the outer air inflow holes 50a open, the air entering through the inlet 24 gradually speeds down, and air flows in through the outer air inflow holes 50a in the counter direction. Accordingly, the flying speed or the inertial movement (flying energy) of the cleaning medium 5 is attenuated.

When the contact opening 18b is separated from the cleaning object 20 in this state, as shown in FIG. 9, the opening 18 becomes open and a large amount of air enters through the contact opening 18b.

As described above, the flying energy of the cleaning medium 5 located near the opening 18 has already been attenuated. Therefore, even by the first stage of the airflow entering through the contact opening 18b, the cleaning medium 5 is completely pushed back into the case 4 and suctioned to the separating plate 14.

When the contact opening 18b is separated from the cleaning object 20, the air flowing in through the outer air inflow holes 50a inevitably slows down. However, by this stage, the air flowing in through the contact opening 18b has already completed the task of assisting the operation of attenuating the flying energy of the cleaning medium 5 and has completely pushed back the cleaning medium 5 into the case 4.

The sizes and the number of the outer a inflow holes 50a are appropriately set so that the cleaning medium 5 is prevented from leaking outside, in consideration of the relationship between the speed of the air flowing in through the inlet 24 and the speed of the air flowing in through the contact opening part 18b.

In the present embodiment, the ventilation unit is constituted by plural outer air inflow holes 50a. However, the ventilation unit may be constituted by slits that extend in the vertical or horizontal direction or a mesh member (the same applies to other embodiments).

Furthermore, in the present embodiment, the cleaning medium leakage prevention unit 32A can expand and contract in the direction in which the case 4 contacts and separates from the cleaning object 20 as described above. Therefore, the volume of the opening 18 changes in accordance with this movement. However, in an embodiment of the present invention, the cleaning medium leakage prevention unit 32A may have an opening 18 whose volume does not change.

That is to say, in a configuration with an opening 18 having a fixed volume, the outer air may automatically enter from the side surfaces of cleaning medium leakage prevention unit 32A. For example, a contact that contacts with the cleaning object 20 may be provided on the front end of the cleaning medium leakage prevention unit 32A. The switch may be turned on before the contact completely separates from the cleaning object 20, so that the ventilation unit on the side surfaces of the cleaning medium leakage prevention unit 32A is open.

The contact opening 18b is preferably made of an elastic material so that the contact opening 18b follows the shape of the surface of the cleaning object 20, even if the cleaning object 20 has a complex shape.

In order to achieve adhesion between the surface of the cleaning object 20 and the contact opening 18b, the contact opening 18b has contact rims 52b extending substantially horizontally along the four sides of the contact opening 18b.

The entire movable tube 52 may be made of a rubber material so that the contact rims 52b have an elastic function. Alternatively, elastic materials may be fixed to the bottom surfaces of the contact rims 52b to follow the shape of the cleaning object 20.

In the present embodiment, the movable tube 52 is caused to slide (move) by the biasing force of the spring, so that the cleaning process can be performed in any direction. However, in a cleaning process where the cleaning object 20 is placed substantially horizontally and the case 4 is pulled upward to be separated from the cleaning object 20 after the cleaning process, the movable tube 52 may be configured to move according to gravity (the same applies to other embodiments).

The outer air inflow holes 50a may be formed in the movable tube 52. The position where the biasing means is located is not limited to the above; for example, the biasing means may be provided at the inner bottom part of the movable tube 52.

In a case where a sufficient slide stroke cannot be obtained for the movable tube 52 due to the compressed length of the coil spring 54, the recessed part for accommodating the top end of the coil spring 54 may be formed in the top surface of the bracket 51 and the thick portion 4A-3, so that the compressed length of the coil spring 54 is absorbed.

Figure 10:
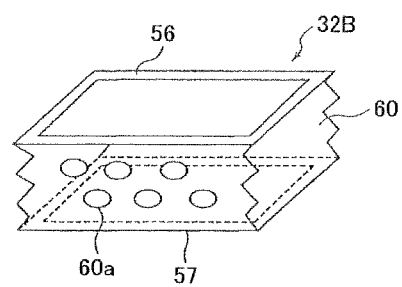
FIG. 10 is a perspective view of a cleaning medium leakage prevention unit according to a second embodiment.

FIG. 10 illustrates a second embodiment. In FIG. 10, elements corresponding to those of the above-described element are denoted by the same reference numerals, and configurations and functions described above are not further described unless necessary, and only descriptions relevant to the second embodiment are given (the same applies to other embodiments).

In the first embodiment, the expanding/contracting movement of the cleaning medium leakage prevention unit 32A is achieved by the fitting/sliding configuration of the fixed tube 50 and the movable tube 52. However, in the present embodiment, the expanding/contracting movement of the cleaning medium leakage prevention unit is achieved by the material of the cleaning medium leakage prevention unit or the flexibility of the shape of the cleaning medium leakage prevention unit.

A cleaning medium leakage prevention unit 32B according to the present embodiment includes a fixed frame 56 that is fixed to the case opening 18a, a movable frame 57 that contacts the surface of the cleaning object 20, and an expanding/contracting body 60 that is a tube having an accordion shape connected between the fixed frame 56 and the movable frame 57. On the side surface of the expanding/contracting body 60, there are plural outer air inflow holes 60a constituting a ventilation unit (only some of the outer air inflow holes 60a are illustrated).

During the cleaning process, the fixed frame 56 and the movable frame 57 come close to each other, and the outer air inflow holes 60a are closed, i.e., the outer air inflow holes 60a are squashed in the contact/separation direction. When the cleaning process is completed and the case 4 is moved, the outer air inflow holes 60a are gradually opened, so that the cleaning medium leakage prevention function is attained according to the same principle as that of the first embodiment.

The expanding/contracting movement of the expanding/contracting body 60 may be achieved by using the elasticity of the material of the expanding/contracting body 60, or a separate elastic body may be added.

The expanding/contracting body 60 does not necessarily need to be made of an elastic material. As long as the outer air inflow holes 60a can be closed when the expanding/contracting body 60 is folded up, the expanding/contracting movement may be achieved by the flexibility of the shape of the expanding/contracting body 60.

Figure 11:
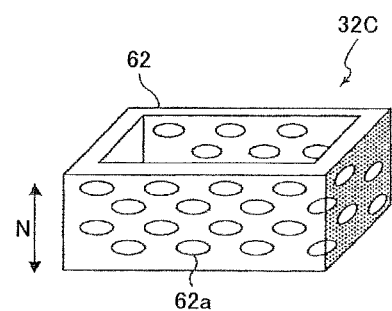
FIG. 11 is a perspective view of a cleaning medium leakage prevention unit according to a third embodiment.

FIG. 11 illustrates a third embodiment. In this example, the expanding/contracting movement is achieved only by the elasticity of the material of the cleaning medium leakage prevention unit.

A cleaning medium leakage prevention unit 32C according to the present embodiment includes an expanding/contracting body 62 that is a square tube made of an flexible member, and outer air inflow holes 62a formed on the side surfaces of the expanding/contracting body 62.

During the cleaning process, the bottom end (front end) of the expanding/contracting body 62 is applied to the surface of the cleaning object 20, so that the expanding/contracting body 62 is compressed in the contact/separating direction (N direction). Accordingly, the outer air inflow holes 62a are squashed and closed.

In order to completely close the outer air inflow holes 62a according to the compression movement of the expanding/contracting body 62, the outer air inflow holes 62a are elongated holes or elliptic holes in which the minor axis (length of short axis) is parallel to the contact/separating direction.

The flexible member may be made of a foam sponge, rubber, or foam urethane.

Figure 12:
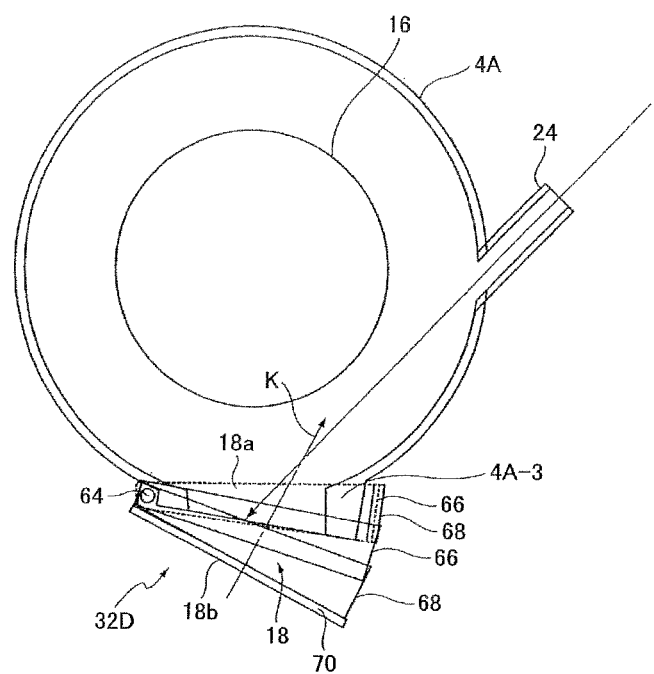
FIG. 12 is a side view of a top case provided with a cleaning medium leakage prevention unit according to a fourth embodiment.

FIG. 12 illustrates a fourth embodiment.

As shown in FIG. 12, the thick portion 4A-3 of the top case 4A has a height difference, and a shaft 69 is supported at a low part of the thick portion 4A-3.

A cleaning medium leakage prevention unit 32D according to the present embodiment includes the shaft 64, an inner tube 66 functioning as a fitting body that can pivot (turn) up and down on the shaft 64 (in the contact/separating direction), an outer tube 68 also functioning as a fitting body that can pivot up and down on the shaft 64 and that is fit and connected to the inner tube 66, a contact frame 70 that is fixed to the front end of the outer tube 68 and that contacts the cleaning object 20, and a biasing member (not shown) that causes the outer tube 68 to protrude toward the cleaning object 20. On the side surface of the inner tube 66, plural outer air inflow holes (not shown) are formed.

During the cleaning process, the inner tube 66 and the outer tube 68 substantially overlap each other as indicated by the dashed lines in FIG. 12, so that the cleaning medium leakage prevention unit 32D is contracted.

When the cleaning process is completed and the case 4 is moved, the inner tube 66 is latched at a predetermined position at a high part of the thick portion 4A-3, and the outer tube 68 slides, so that the outer air inflow holes gradually open. Finally, the outer shape of the cleaning medium leakage prevention unit 32D appears to be a fan shape. The outer air inflow holes may be formed in the outer tube 68.

Figure 13A:
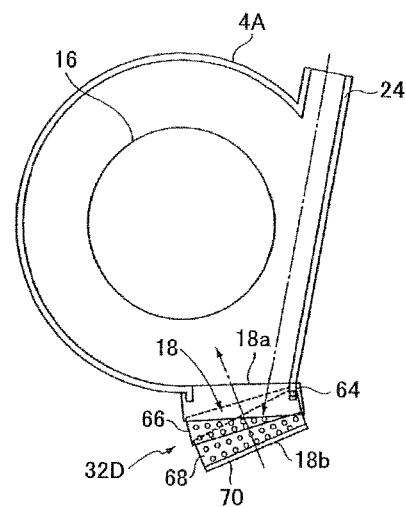
FIGS. 13A and 13B are side views of a top case provided with a cleaning medium leakage prevention unit according to a fifth embodiment, where
Figure 13B:
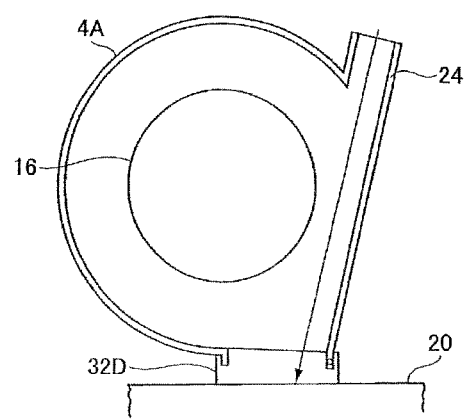

FIGS. 13A and 13B illustrate a fifth embodiment, which is a modification of the fourth embodiment.

In the present embodiment, as shown in FIG. 13B, the airflow from the inlet 24 is directed toward the cleaning object 20 in a substantially perpendicular direction. As the cleaning medium 5 collides with the cleaning object 20 in a substantially perpendicular direction, a powerful cleaning performance can be achieved.

However, in this configuration, the opening 18 is located at a position that is deviated from the revolving airflow path. Therefore, due to the air that flows in when the opening 18 is opened, a revolving airflow in the counter direction is generated as indicated by an arrow K in FIG. 12. Accordingly, the cleaning medium 5 may flow backward and enter the inlet 24.

In order to eliminate such circumstances, in the present embodiment, the airflow control property of the expanding/contracting movement of the fan shape used to control the airflow, which flows in from the opening 18 when the opening 18 is opened, to flow in a direction that does not face the inlet 24.

As shown in FIG. 13A, the cleaning medium leakage prevention unit 32D has the shaft 64 provided on the inlet 24 side in the horizontal direction, which is on the opposite side to that of the configuration illustrated in FIG. 12.

In the space in the fan-shaped space having a short flow path, the direction of the airflow from the opening 18 is substantially orthogonal to the contact opening 18b. Therefore, depending on the position of the contact opening 18b when the cleaning medium leakage prevention unit 32D is expanded into a fan shape, it is possible to control the direction in which the air flows in.

As shown in FIG. 13A, the direction orthogonal to the contact opening 18b changes to a direction pointing toward the center of the case 4 when the cleaning medium leakage prevention unit 32D is expanded into a fan shape. Accordingly, it is possible to prevent a revolving airflow in a counter direction to be generated in the case 4 due to the air that flows in when the opening 18 is opened, so that the cleaning medium 5 is prevented from flowing backward into the inlet 24.

In a simplified version of the present configuration, the inner tube 66 and the outer tube 68 are not included, and only the contact frame 70 that can turn is included. Most of the flakes of the cleaning medium 5 that leak outside tend fly along the surface of the cleaning object 20. Thus, if the contact frame 70 contacts the cleaning object 20, most of the flakes of the cleaning medium 5 can be prevented from leaking out. As the inner tube 66 and the outer tube 68 are not included, every time the case 4 separates from the cleaning object 20, a large gap is formed and a large amount of the outer air flows in. Accordingly, the flying energy of the cleaning medium 5 can be quickly attenuated.

Figure 14:
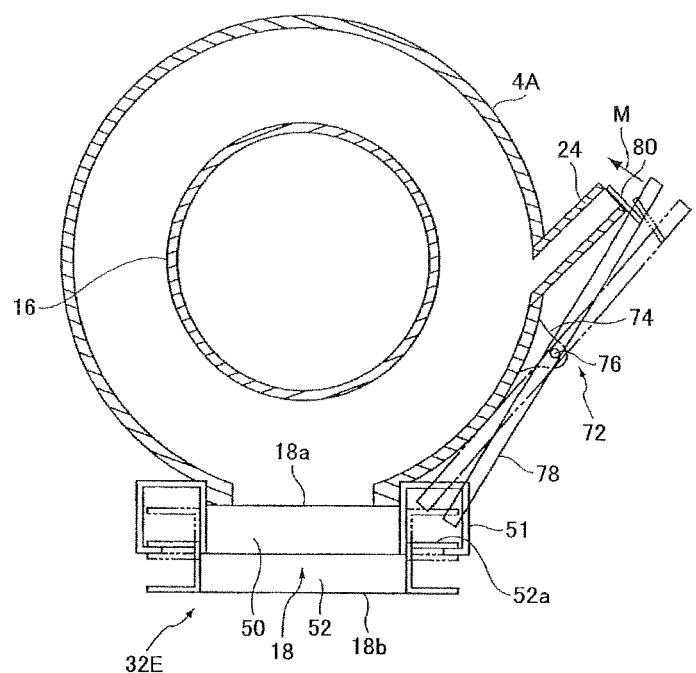
FIG. 14 is a side view of a top case provided with a cleaning medium leakage prevention unit and a ventilation path closing unit according to a sixth embodiment.

FIG. 14 illustrates a sixth embodiment.

In the present embodiment, there is provided a ventilation path closing unit for closing the inlet 24 in coordination with the expanding movement of the cleaning medium leakage prevention unit. As described above, if the inlet 24 is closed before the opening 18 is opened, the cleaning medium 5 is prevented from scattering out from the opening 18. Therefore, the inlet 24 is automatically closed with the use of the expanding/contracting movement of the cleaning medium leakage prevention unit.

With the above-described configuration, it is possible to further improve the cleaning medium leakage prevention function and avoid the problem that arises when a worker forgets to block the inlet 24, with a low-cost configuration.

A cleaning medium leakage prevention unit 32E according to the present embodiment includes the fixed tube 50 fixed to the outside of the thick portion 4A-3 and the movable tube 52. The coil spring 54 is not included.

A ventilation path closing unit 72 includes a support frame 74 provided on the outside of the top case 4A, a shaft 76 supported by the support frame 74, a lever 78 that pivots (turns) on the shaft 76, a cap member 80 provided on the top end of the lever 78, and a torsion spring not shown) that is provided on the shaft 76 and that constantly biases the lever 78 in the direction indicated by an arrow M.

When the cleaning medium leakage prevention unit 32E is compressed at the time of cleaning, the bottom end of the lever 78 is pushed by the latch parts 52a of the movable tube 52, and the lever 78 turns in the clockwise direction as shown by virtual lines. Accordingly, the cap member 80 comes off the air intake opening of the inlet 24, so that a revolving airflow can be generated.

When the cleaning process ends and the case 4 moves, and as the movable tube 52 slides, the lever 78 turns by the biasing force of the torsion spring as indicated by the line M. Accordingly, the air intake opening of the inlet 24 is closed by the cap member 80. Other than the torsion spring, a compression spring and a pulling spring may be used as the biasing means.

At the air intake opening of the inlet 24, there may be provided a mechanism for opening and closing the air intake opening with an electrical actuator such as a solenoid and a motor, or an electromagnetic valve. A switch, which operates by the expanding/contracting movement of the cleaning medium leakage prevention unit 32E, may drive the opening and closing mechanism or the electromagnetic valve, to open and close the air intake opening of the inlet 24.

As described above, the material properties and the sizes of the cleaning medium may be appropriately selected according to the type of dirt on the cleaning object. In the following, a description is given of a cleaning medium appropriate for removing a film-shaped substance adhering to the cleaning object such as flux.

FIGS. 15A through 15D are schematic diagrams indicating different patterns where a thin flake of the cleaning medium collides with the cleaning object.

Figure 15A:
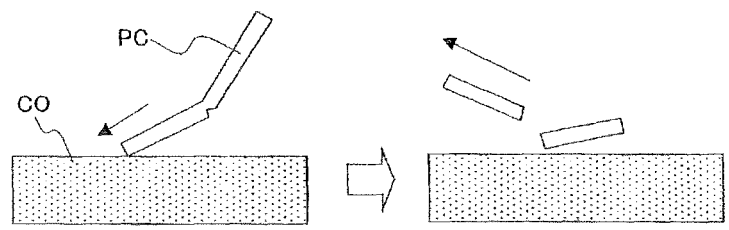
FIGS. 15A through 15D are schematic diagrams indicating different patterns where a thin flake of the cleaning medium collides with the cleaning object.
Figure 15B:
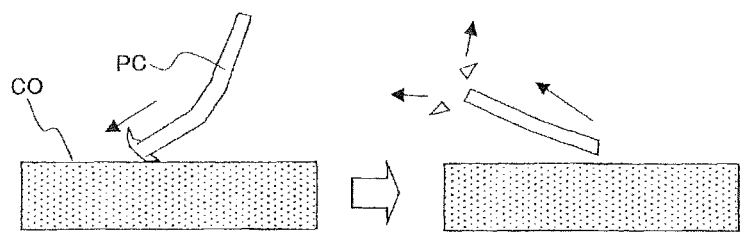
Figure 15C:
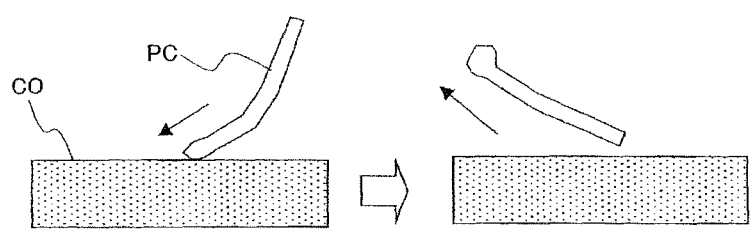

In the case of a cleaning medium that can easily elastically deform, as shown in FIG. 15C, the end of the cleaning medium deforms by a large extent, and therefore the contact area increases and the impact is alleviated. Consequently, the contacting force at the end of the cleaning medium is distributed at the time of the collision, and the cleaning performance decreases. Thus, the extent by which the cleaning medium cuts into the film-shaped adhering substance is decreased, and the cleaning efficiency of the cleaning device is decreased.

Figure 15D:
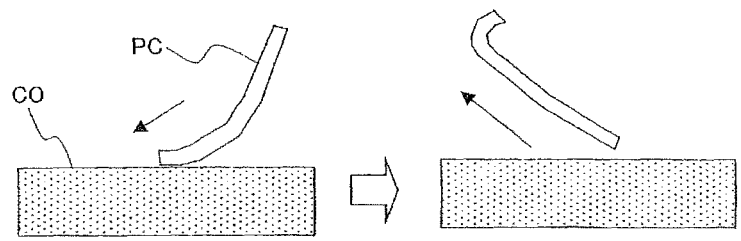

In the case of a cleaning medium that is prone to ductile breaking, as shown in FIG. 15D, the breaking end of the cleaning medium elastically deforms by a large extent, and therefore the contact area increases and the impact is alleviated. Consequently, the contacting force at the end of the cleaning medium is distributed at the time of the collision, and the cleaning performance decreases. Thus, the extent by which the cleaning medium cuts into the film-shaped adhering substance is decreased, and the cleaning efficiency of the cleaning device is decreased.

Conversely, in the case of a cleaning medium that is prone to brittle breaking, the breaking end of the cleaning medium elastically deforms by a small extent, and therefore the contacting area is hardly distributed at the end of the cleaning medium.

Furthermore, even if the film-shaped substance adheres to the end of the cleaning medium, by repeating brittle breaking, a new end of the cleaning medium can be repeatedly formed. Therefore, the cleaning efficiency does not decrease.

Examples of a brittle material are a glass fragment, a ceramic fragment, and a resin film fragment made of, for example, acrylic resin, polystyrene, and polylactic acid.

As a bending force is repeatedly applied to the cleaning medium, the cleaning medium eventually breaks. In an embodiment of the present invention, it is defined as to whether the cleaning medium is brittle, according to the folding resistance of the cleaning medium.

When a recording medium made of a brittle material having a folding resistance of less than 65 is used, the burr, which is formed in the cleaning medium as a result of repeatedly colliding with the cleaning object, breaks off from the cleaning medium and is discharged (see FIG. 15B). As the burr does not remain on the cleaning medium, the edge of the cleaning medium is maintained.

Furthermore, when a recording medium made of a brittle material having a folding resistance of less than 10 is used, the cleaning medium breaks in the middle before a burr is formed, so that new edges are formed (see FIG. 15A).

Accordingly, edges of the cleaning medium are maintained. As the edges of the cleaning medium are maintained, the extent by which the cleaning medium cuts into the film-shaped adhering substance at the time of collision does not decrease. Therefore, the performance of the cleaning medium in terms of removing adhered films from the cleaning object (adhering substance removing performance) does not deteriorate over time.

A thin flake of the cleaning medium is defined to have a thickness of greater than or equal to 0.02 mm and less than or equal to 0.2 mm, and an area of less than or equal to 100 mm$^2$.

The pencil hardness described below is measured by a method complying with JIS K-5600-5-4 (JIS: Japanese Industrial Standards), and corresponds to the lead number of the hardest pencil with which scratches and dents are not formed on the flake of the cleaning medium being tested.

Furthermore, the folding resistance described below is measured by a method complying with JIS P8115, and corresponds to the number of times a flake of the cleaning medium is bent until the flake breaks. Specifically, the flake of the cleaning medium is bent at 135 degrees by R=0.38 mm.

EXAMPLE

In this example, a pallet on which flux is adhering was used as a sample of a cleaning object. The pallet was made of epoxy resin including glass fiber. The pallet is used for masking areas of a PCB (print-circuit board) during a soldering procedure performed with a flow solder bath. By repeatedly using this kind of mask jig, flux accumulates on the mask jig as a thick film. Therefore, the flux needs to be removed periodically. The pencil hardness of the adhered flux was 2B. The thickness of the flux was 0.5 mm through 1 mm.

As the cleaning device, the dry type cleaning device 2 shown in FIG. 1 was used. In the cleaning device, a suction unit having a suction capability corresponding to a vacuum degree of 20 Kpa was used. A pallet to which flux is adhering was prepared. An area of the opening 45 mm×60 mm was used as one sample unit, and the cleaning was performed for three seconds. Two grams of the cleaning medium was used for the cleaning process. Table 1 indicates the flakes of the cleaning medium that were used and the corresponding cleaning results.

The determination symbols in Table 1 have the following meanings.

x: Hardly any of the dirt was removed.
Δ: Some of the dirt is remaining after cleaning.
○: Substantially cleaned.
⊚: Very much cleaned.
-: The cleaning medium is depleted and all of the cleaning medium flakes are discharged from the cleaning bath.

The folding resistance and the pencil hardness are shown as the physicality of each cleaning medium in Table 1.

According to the determination results of the initial cleaning performance shown in Table 1, hardly any of the flux is removed when the pencil hardness of the cleaning medium is less than or equal to the pencil hardness 2B of the flux. This is because when the cleaning medium collides with the flux, the cleaning medium cannot cut into the film-shaped flux.

The airflow causes the cleaning medium to fly and repeatedly collide with the cleaning object. According to the collision, the cleaning medium is gradually damaged, and eventually breaks or deforms.

Figure 16:
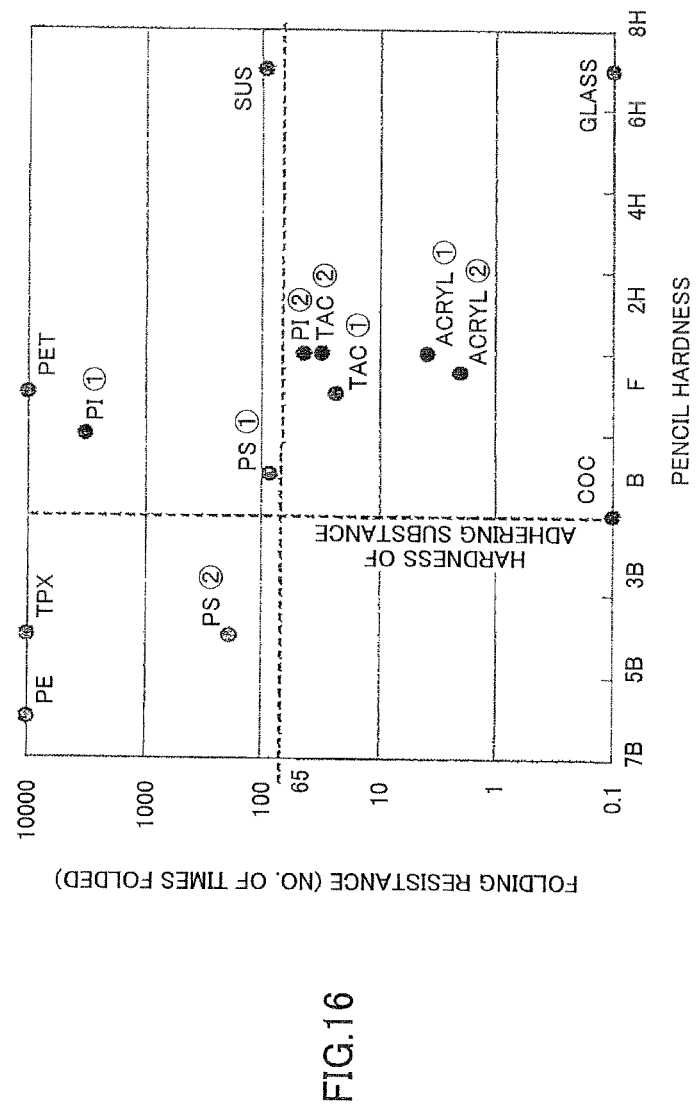
FIG. 16 indicates a distribution of mechanical physicality of cleaning media.

The distribution of the mechanical physicality (folding resistance and pencil hardness) of each cleaning medium is illustrated in FIG. 16.

Based on Table 1 and FIG. 15, the deterioration patterns of the cleaning medium are described once again in detail. In the case of the cleaning medium having a folding resistance of less than 10 such as glass, acryl 1 (the accompanying number is circled in the table; the same applies hereinafter), acryl 2, and COC (polyolefin), the cleaning medium breaks in the middle due to the impact of the collision as illustrated in FIG. 15A. The broken surface becomes a new edge and cuts into the flux, and therefore the adhering substance removing performance does not deteriorate.

In the case of the cleaning medium made of a material having a folding resistance of greater than or equal to 10 and less than or equal to 52 such as TAC 1, TAC 2, and PI 2, the cleaning medium does not break in the middle. Instead, as shown in FIG. 15B, a burr is formed at the edge due to the impact of the collision, and only the burr breaks. As the thickness of the cleaning medium is maintained, the cleaning medium cuts into the flux, and the removing effect is maintained.

When the folding resistance of the material of the cleaning medium is greater than or equal to 65, the cleaning medium does not break due to impact, and the edge parts elastically deforms.

FIG. 15C illustrates the case where the cleaning medium elastically deforms, the edge is crushed, and the end part droops. PI 1 corresponds to this case.

FIG. 15D illustrates a case where the edge of the cleaning medium elastically deforms and curls. SUS, PS1, PS2, PE, PET, and TPX correspond to this case.

As to the cleaning medium shown in the examples of FIGS. 15C and 15D, the edge elastically deforms and droops. Therefore, the impact at the time of collision is alleviated. Accordingly, as shown in Table 1, the cleaning performance significantly deteriorates after processing plural samples.

According to these results, good results can be stably achieved for a long period of time by using a cleaning medium having the following properties to remove the adhering film-shaped flux. Specifically, the cleaning medium is to have pencil hardness that is greater than or equal to that of the flux, and is made of a brittle material having a folding resistance of greater than or equal to zero and less than or equal to 52.

Table 2 indicates the ranges of the folding resistance for each cleaning medium, as the basis of the values given in the present embodiment.

As indicated in Table 2, a flake-shaped cleaning medium whose minimum folding resistance is zero (in this case, glass, COC, and acryl 2) is a material that is significantly prone to break, and becomes depleted within a significantly short period of time as shown in Table 1. Therefore, the running cost becomes high.

PI 2, which indicated good cleaning properties, had a maximum folding resistance of 52. Thus, the cleaning medium more preferably has a folding resistance of greater than or equal to one and less than or equal to 52, to maintain good cleaning performance for a long period of time.

Furthermore, among the cleaning media that indicates brittle breaking as illustrated in FIG. 15A, the cleaning medium with the maximum folding resistance was acryl 1, having a folding resistance of nine. Accordingly, a cleaning medium having a folding resistance of greater than or equal to zero and less than or equal to nine is subjected to brittle breaking as illustrated in FIG. 15A, and a cleaning medium having a folding resistance of greater than or equal to 10 and less than or equal to 52 is subjected to brittle breaking as illustrated in FIG. 15B.

A cleaning medium made of acryl 2 having a minimum folding resistance of zero is significantly prone to breaking, and could not withstand usage for a long period of time as indicated in Table 1. Meanwhile, the cleaning medium made of acryl 1 having a minimum folding resistance of one was able to maintain cleaning performance for a long period of time as indicated in Table 1.

TABLE 1

| | CLEANING MEDIUM | | | | NUMBER OF PROCESSED SAMPLES | |
|---|---|---|---|---|---|---|
| NO. | MATERIAL | THICKNESS (μ) | FOLDING RESISTANCE | PENCIL HARDNESS | 1 | 30 |
| 1 | POLYOLEFIN | 155 | 0 | B | X | — |
| 2 | GLASS | 100 | 0 | GREATER THAN OR EQUAL TO 9H | ◉ | — |
| 3 | ACRYL ② | 125 | 2 | H~F | ○ | — |
| 4 | ACRYL ① | 125 | 4 | 2H | ○ | ○ |
| 5 | TAC (TRIACETATE) ① | 120 | 24 | H | ○ | ○ |
| 6 | TAC (TRIACETATE) ② | 105 | 32 | 2H | ○ | ○ |
| 7 | PI (POLYIMIDE) ② | 135 | 45 | 2H | ○ | ○ |
| 8 | PS (POLYSTYRENE) ① | 130 | 88 | HB | Δ | X |
| 9 | SUS (STAINLESS) | 20 | 95 | GREATER THAN OR EQUAL TO 9H | ◉ | X |
| 10 | PS (POLYSTYRENE) ② | 150 | 190 | 4B | X | X |
| 11 | PI (POLYIMIDE) ① | 125 | 3250 | F | Δ | X |
| 12 | PE (POLYETHYLENE) | 100 | GREATER THAN OR EQUAL TO 10000 | 6B | X | X |
| 13 | TPX | 100 | GREATER THAN OR EQUAL TO 10000 | 4B | X | X |
| 14 | PET | 110 | GREATER THAN OR EQUAL TO 10000 | H | Δ | X |

NOTES:
Δ X MEAN THAT THE FLAKE CURLED DUE TO ELASTIC DEFORMATION
X MEANS THAT THE END PART OF FLAKE DROOPED DUE TO ELASTIC DEFORMATION

TABLE 2

| NO. | MATERIAL | AVERAGE FOLDING RESISTANCE | MAXIMUM FOLDING RESISTANCE | MINIMUM FOLDING RESISTANCE |
|---|---|---|---|---|
| 3 | ACRYL ② | 2 | 8 | 0 |
| 4 | ACRYL ① | 4 | 9 | 1 |
| 7 | PI ② | 45 | 52 | 41 |
| 8 | PS ① | 88 | 115 | 65 |

Based on Table 1, the cleaning medium preferably has the following properties to remove the adhering film-shaped flux. Specifically, the cleaning medium is to have pencil hardness that is greater than or equal to that of the flux, and has a folding resistance of greater than or equal to 2 and less than or equal to 45.

With a dry type cleaning case according to an embodiment of the present invention, when the case is moved away from a cleaning object, the cleaning medium is reliably prevented from flying out of the opening, because the flying speed of the cleaning medium can be attenuated with the airflow flowing in from outside before the opening is completely opened, and therefore the working environment can be improved.

The present invention is not limited to the specific embodiments described herein, and variations and modifications may be made without departing from the scope of the present invention.

The present application is based on Japanese Priority Applications No. 2010-252120 filed on Nov. 10, 2010 and No. 2011-133251 filed on Jun. 15, 2011 with the Japan Patent Office, the entire contents of which are hereby incorporated by reference.

The invention claimed is:

1. A dry type cleaning case for cleaning a cleaning object by causing a cleaning medium to fly by a revolving airflow and applying the cleaning medium to the cleaning object, the dry type cleaning case comprising:
   a case unit; and
   a cleaning medium leakage prevention unit,
   wherein the case unit includes
      an inner space in which the cleaning medium flies,
      an opening that contacts the cleaning object so that the cleaning medium collides with the cleaning object,
      a ventilation path through which air flows into the inner space from outside,
      a suction opening that suctions the air that has been guided into the inner space through the ventilation path, to generate the revolving airflow in the inner space, and
      a porous unit through which a substance removed from the cleaning object is passed to the suction opening,
   wherein the cleaning medium leakage prevention unit prevents the cleaning medium from leaking outside through the opening from the inner space, by causing outer air to flow in when the case unit is separated from the cleaning object, the cleaning medium leakage prevention unit is provided at the opening of the case unit,
   wherein the cleaning medium leakage prevention unit includes
      a tube that can expand and contract in a contact/separation direction, the contact/separation direction being a direction in which the case unit contacts with and separates from the cleaning object, and
      a ventilation unit formed on side surfaces of the tube,
   wherein when the tube contracts, the ventilation unit is closed.

2. The dry type cleaning case according to claim 1, wherein the tube includes
   a fixed tube that is fixed or latched to the case unit, and
   a movable tube that is fit to the fixed tube so as to be movable in the contact/separation direction,
   wherein the ventilation unit is formed on side surfaces of at least one of the fixed tube and the movable tube.

3. The dry type cleaning case according to claim 2, wherein
   the fixed tube and the movable tube constitute plural fitting bodies that turn in the contact/separation direction by using a common shaft as a pivot point, and
   the plural fitting bodies form a fan shape when the tube is expanded.

4. The dry type cleaning case according to claim 2, wherein the cleaning medium leakage prevention unit further includes a biasing member that causes the movable tube to protrude in the contact/separation direction, when the case unit is not contacting the cleaning object.

5. The dry type cleaning case according to claim 2, wherein the movable tube protrudes in the contact/separation direction, by gravity.

6. The dry type cleaning case according to claim 1, wherein the tube has an accordion shape.

7. The dry type cleaning case according to claim 1, wherein the tube is made of a flexible member.

8. The dry type cleaning case according to claim 7, wherein
   the ventilation unit is constituted by plural outer air inflow holes, and
   the plural outer air inflow holes are elongated holes in which a minor axis extends in the contact/separation direction.

9. The dry type cleaning case according to claim 7, wherein the flexible member is made of at least one of a foam sponge, rubber, and foam urethane.

10. The dry type cleaning case according to claim 1, further comprising:
    a ventilation path closing unit that closes the ventilation path in coordination with an expanding movement of the tube, when the case unit is separated from the cleaning object.

11. The dry type cleaning case according to claim 10, wherein
    the ventilation path closing unit is supported on an outer surface of the case unit in a manner as to freely turn, wherein
    the ventilation path closing unit includes
    a lever that has one end contacting the tube and that moves according to an expanding/contracting movement of the tube, and
    a cap member that is provided on another end of the lever and that closes the suction opening when the tube expands.

12. A dry type cleaning device comprising:
    the dry type cleaning case according to claim 1;
    the cleaning medium that is accommodated in the case unit or that is supplied to the case unit; and
    a suction unit that is connected to the suction opening of the dry type cleaning case.

* * * * *